United States Patent
Carrozzi

(10) Patent No.: US 6,265,876 B1
(45) Date of Patent: Jul. 24, 2001

(54) METHOD TO IMPROVE THE EFFICIENCY OF COIL SYSTEMS, PARTICULARLY IN DEVICES FOR NUCLEAR MAGNETIC RESONANCE IMAGE ACQUISITION, AND COIL SYSTEM TO IMPLEMENT THIS METHOD

(75) Inventor: Alessandro Carrozzi, La Spezia (IT)

(73) Assignee: Esaote, S.p.A., Monferrato (IT)

( * ) Notice: Subject to any disclaimer, the term of this patent is extended or adjusted under 35 U.S.C. 154(b) by 0 days.

(21) Appl. No.: 09/608,018

(22) Filed: Jun. 30, 2000

Related U.S. Application Data

(63) Continuation of application No. 08/974,219, filed on Nov. 19, 1997, now abandoned.

(30) Foreign Application Priority Data

Nov. 20, 1996 (IT) .............................................. SV9600039

(51) Int. Cl.[7] ...................................................... G01V 3/00
(52) U.S. Cl. ........................................... 324/318; 324/322
(58) Field of Search ..................................... 324/318, 322, 324/300, 312, 314, 307, 309; 600/423, 424

(56) References Cited

U.S. PATENT DOCUMENTS

| | | |
|---|---|---|
| 4,766,383 * | 8/1988 | Fox et al. .............................. 324/318 |
| 4,820,988 | 4/1989 | Crooks et al. . |
| 4,897,604 | 1/1990 | Carlson et al. . |
| 5,177,441 | 1/1993 | Morich et al. . |
| 5,185,577 | 2/1993 | Minemura . |
| 5,278,504 | 1/1994 | Patrick et al. . |
| 5,329,232 | 7/1994 | Gilderdale . |
| 5,351,688 | 10/1994 | Jones . |
| 5,370,118 | 12/1994 | Vij et al. . |
| 5,379,767 * | 1/1995 | Derby et al. ...................... 128/653.5 |
| 5,424,643 | 6/1995 | Morich et al. . |
| 5,451,875 | 9/1995 | Patrick et al. . |
| 5,500,594 * | 3/1996 | Leussler ............................... 324/318 |
| 5,519,321 | 5/1996 | Hagen et al. . |

OTHER PUBLICATIONS

Head and Neck Vascular Array Coil for MRI; Ravi Srinivasan et al; 1994.

* cited by examiner

Primary Examiner—Louis Arana
(74) Attorney, Agent, or Firm—Burns, Doane, Swecker & Mathis, L.L.P.

(57) ABSTRACT

A method to improve the efficiency of coil systems in devices for NMR image detection, by of a quadrature coil system (1, 2; 3, 4), having at least two coils, whose magnetic fields follow orthogonal directions. The method according to the invention provides the deformation of the two coils (1, 2, 3, 4) in accordance with the peculiar geometrical characteristics of the parts, or limbs, or bodies to be examined and in such a way that the magnetic fields associated to the two coils contain, in the relevant volume, being meant to contain the body under examination or a part thereof, different and complementary areas of concentration (B1, B2; B3, B4), hence of higher sensitivity and efficiency, of the magnetic field, the combination of the complementary areas (B1, B2; B3, B4) generating a comprehensive magnetic field with a predetermined higher intensity and homogeneity in the relevant volume, which is meant to contain the body under examination or a part thereof.

16 Claims, 2 Drawing Sheets

METHOD TO IMPROVE THE EFFICIENCY OF COIL SYSTEMS, PARTICULARLY IN DEVICES FOR NUCLEAR MAGNETIC RESONANCE IMAGE ACQUISITION, AND COIL SYSTEM TO IMPLEMENT THIS METHOD

This application is a continuation of application Ser. No. 08/974,219, filed Nov. 19, 1997 abandoned.

BACKGROUND OF THE INVENTION

The invention relates to a method for improving the efficiency of coil systems, particularly in devices for Nuclear Magnetic Resonance image acquisition, and in particular in which the coil system is a quadrature coil system.

RELATED ART

Currently, quadrature coil systems are used both to capture the echoes of nuclear spins induced by at least one exciting pulse, and to transmit the exciting pulses of nuclear spins.

The receptive sensitivity and the transmission efficiency are both related with the characteristics of the magnetic field associated with the coil system.

The expression magnetic field associated with each coil of the system, refers to the component thereof which is orthogonal to a polarizing static magnetic field. The relevant component of the quadrature coil system consists of an appropriate vector addition of the orthogonal components of the magnetic fields associated with the single coils of the system, at least one of the said components being multiplied by a predetermined weighting factor.

As for the reception of the resonance echoes of nuclear spins, thanks to the sensitivity of the different orthogonal components of the magnetic fields associated with the two quadrature coils, the noise components that the coils receive are incoherent with each other, so the sum of the signals produces a total noise which is only √2 and not twice the noise, with a consequent improvement of the signal-to-noise ratio.

On transmission, the power of the transmitted radio-frequency signal will be higher, the more intense the magnetic field associated with the configuration of the coils is.

Particularly in receiving coil systems, though the reachable theoretical gain of the signal-to-noise ratio through quadrature coils is about 41%, only smaller gains are obtainable in practice, and currently, for certain field configurations, even considerably smaller than the theoretical value.

This is caused by additional restrictions that the quadrature coil system must meet. First, in order to obtain valuable images for diagnostic purposes from the Nuclear Magnetic Resonance signals, the magnetic field resulting from the coil system is to be substantially homogeneous, within a predetermined tolerance range, at least in one predetermined area in which the part, limb or body under examination are to be placed. Further, the form and size of the coil system are to be designed in such a way as to enable the parts of the bodies under examination or the relevant areas thereof to enter the areas of the magnetic field of the quadrature coil systems, having a predetermined sensitivity and a sufficient homogeneity. In addition to all this, the quadrature coil systems are to be as little bulky and expensive as possible.

Currently, the coils in quadrature coil systems are conformed in such a manner that the magnetic field associated therewith have a predetermined sufficient sensitivity, that is a predetermined sufficient intensity of the magnetic field, and with a predetermined homogeneous distribution of the sensitivity throughout the examined area of the body, that is throughout the area enclosed inside the coil. This requires forms and configurations of coils ensuring both the sensitivity, i.e., intensity level of the magnetic field associated thereto, and the predetermined homogeneous distribution of the said sensitivity in the relevant volume, to obtain serviceable image information.

In the attempt to reduce the space requirement of coil systems, advantageous results have been obtained by the production of different types of the systems, specifically dimensioned for the treatment of one type or some types of limbs. However, the need to have magnetic fields which ensure, inside a predetermined volume, the necessary sensitivity, homogeneously distributed therein, and to account for the different sizes that the limbs may have, always involves huge dimensions of receiving coil systems.

OBJECTS AND SUMMARY

An object of the invention is to implement a method for improving the efficiency of a coil system of the so-called quadrature type, allowing it to get nearer to theoretical gains, with no considerable cost increase and, at the same time, to limit the space required by the system, and to provide reliable and valuable images for diagnostic purposes.

The invention solves the above problem with a method of the type described hereinbefore, in which the following steps are provided:

a) The deformation of at least one, preferably both coils of the system, according to the peculiar geometrical characteristics of the parts, i.e. limbs, or bodies to be examined;

b) and in such a way that the magnetic fields individually associated to each of the two coils have, within the relevant volume, being meant to contain the body under examination or a part thereof, different and substantially complementary areas of higher concentration, hence of higher intensity, i.e., of higher sensitivity or efficiency, of the magnetic field, the combination of the said complementary areas generating a comprehensive magnetic field with a predetermined higher intensity and homogeneity in the relevant volume, which is meant to contain the body under examination or a part thereof.

According to an enhancement, the method according to the invention provides the deformation of at least one and/or both the quadrature coils, in such a way as to obtain, within predetermined areas of the volume being meant to contain the body under examination or a part thereof, a concentration of the magnetic field with a predetermined homogeneity, the boundaries between the different complementary concentration areas being defined along lines of equal intensity of the magnetic field, corresponding to a predetermined attenuation with respect to the maximum value.

Particularly, the boundaries between the different areas of concentration of the magnetic field are defined along lines of equal intensity corresponding to a 10% to 30% reduction with respect to the maximum intensity of the field in the complementary areas, especially along lines of equal intensity corresponding to a 20% reduction of the intensity of the magnetic field.

The values for the definition of the line of equal intensity which defines the boundaries of the complementary areas of higher concentration of the magnetic field are determined, for at least one of the coils, through appropriate weighting by means of factors calculated as a function of the signal-to-noise ratios obtainable with the two coils.

According to a further characteristic of the method and of the coil system, at least one of the quadrature coils may be deformed in such a manner, that the magnetic field associated thereto and/or the comprehensive one are strongly attenuated or even null, in certain predetermined areas of the relevant volume, corresponding to one or more parts of the body, whose examination is of no interest.

The receiving quadrature coil system according to the invention provides at least one pair of coils, at least one of the said coils, preferably both of them, being deformed according to the geometrical/morphological characteristics of the body under examination and in such a way that the magnetic fields associated thereto contain areas of higher concentration and intensity of the magnetic field in the volume being meant to contain at least one relevant part of the body under examination, for the detection of Nuclear Magnetic Resonance images of that part, the said areas of higher concentration, i.e. intensity of the said magnetic fields complementing each other to obtain a comprehensive magnetic field with a predetermined intensity and with a predetermined homogeneity, which permeates the whole volume being meant to contain the body under examination or a part thereof.

Advantageously, the coils are deformed in such a way as to concentrate the area of higher intensity of the associated magnetic field in one portion of the volume being meant to contain the body under examination and corresponding to a part thereof, strongly reducing or annulling the magnetic field in the areas of the said volume which are outside the predetermined relevant area of the body under examination.

Thanks to these expedients, the efficiency of the quadrature coil system can be improved, and the theoretically reachable gains and efficiency can be obtained. The magnetic fields concentrated in predetermined areas and with a predetermined sufficient homogeneity ensure a considerable increase of the signal-to-noise ratio on reception, whereas, in transmitting coil systems, the transmitted power is higher. All this without affecting the fidelity and quality of the obtained image.

As far as the economical costs for construction and implementation are concerned, the deformation of the coils, when compared to the traditional combination of perfectly circular coils, with pairs of perfectly symmetrical rotation saddle coils, that is expanding along cylindrical generatrices, does not require a considerable increase of manufacturing costs.

The deformation of the coils also allows for an adaptation of their geometry to the morphology of the body to be examined.

Thus, for example, in a device for Nuclear Magnetic Resonance image detection, comprising quadrature coil systems for reception and/or transmission, and being meant for the examination of substantially flat bodies or limbs, the coils may be given a shape which is substantially elliptical or anyway flattened on two diametrically opposite sides, hence most of the space required to the more variable dimension of the limb.

A particular quadrature coil system of this type consists, for example, of an annular, substantially elliptical coil, combined with a double-facing saddle coil, which extends over a surface being elliptical itself, and concentric to the first elliptical coil.

A further embodiment consists of the combination of an elliptical annular coil and a single-saddle coil.

Especially in this case, the saddle is obtained by arching and bending in the area of two diametrically opposite points which are substantially coincident with the areas in which the elliptical annular coil crosses a second elliptical annular coil. This configuration is particularly suitable for the examination of limbs like feet. The particular conformation of the coils not only allows to account for the dimensions of the limb which are more variable in size, but, in this case, also facilitates the introduction of the limb itself into the examining position.

In both cases, it is evident that the coil system is adapted to the morphological characteristics of the limb and that the space required by the coil system may be reduced or kept within certain limits, though accounting for the different possible measures or sizes of the bodies under examination.

In the case of the two examples, most of the space required to take into account the different sizes of the bodies under examination, is substantially limited to one direction, that is in the direction of the major axis of the elliptical shape, whereas, in traditional circularly or cylindrically symmetrical coils, a dimensional increase according to an axis would also require an increase according to the axis orthogonal thereto.

The invention also relates to other enhancements which form the subject of the dependent claims.

BRIEF DESCRIPTION OF THE DRAWINGS

The invention and the advantages derived therefrom will be understood more clearly form the following description of some embodiments illustrated without restriction in the accompanying drawings, in which.

DETAILED DESCRIPTION OF THE PREFERRED EMBODIMENTS

In the annexed figures, the coils are diagrammatically illustrated, and provided with a very limited number of windings, in order to make the inventive concept clearer. In fact, each coil is composed of a considerable number of windings, depending on specific needs.

Figure 2:
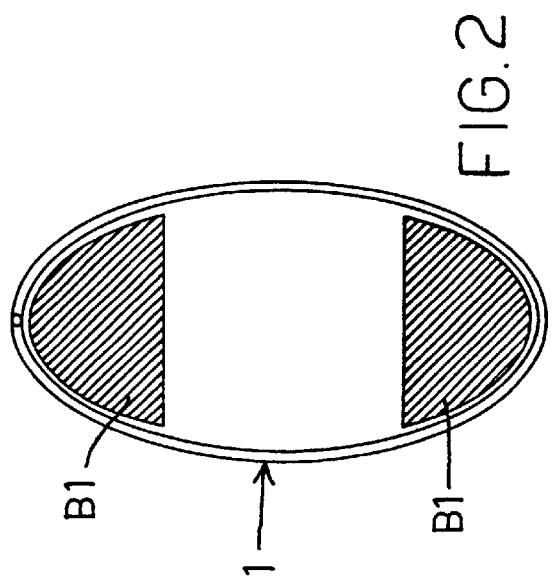
FIG. 2 and FIG. 3 are diagrammatic views, sectional with respect to the axes of the elliptical generatrix, of the complementary areas of concentration of the magnetic field.
Figure 3:
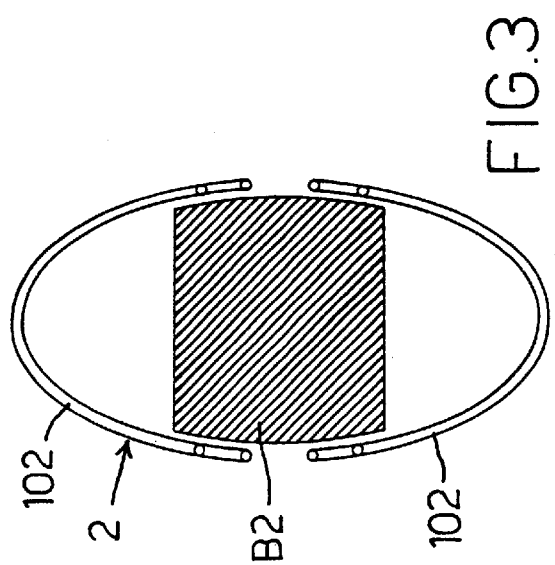
Figure 1:
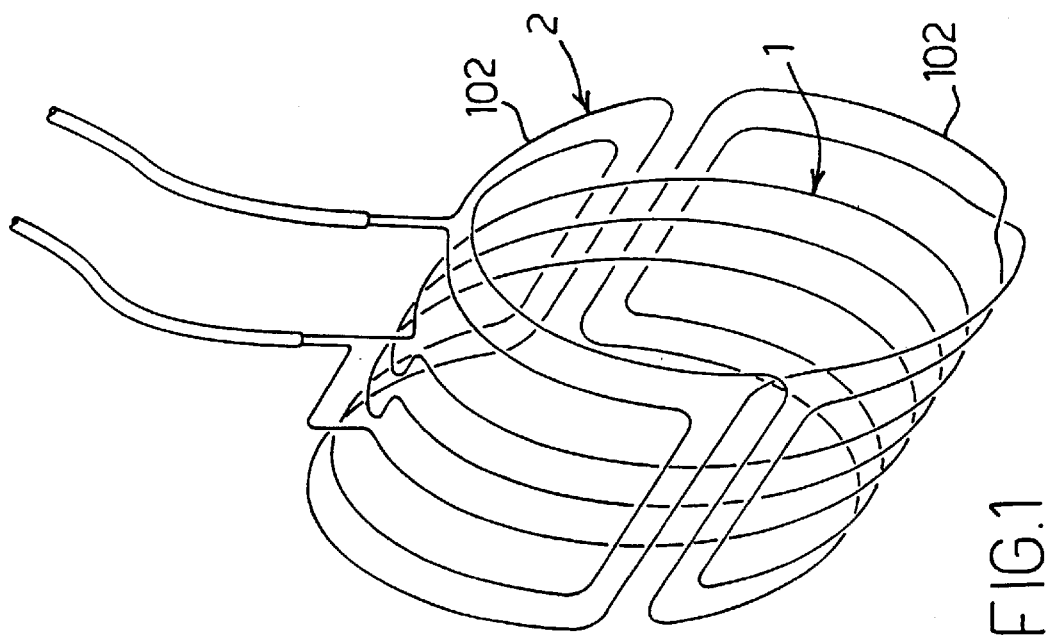
FIG. 1 shows a first embodiment of a receiving quadrature coil system according to the invention, particularly suitable for the detection of Nuclear Magnetic Resonance images of body parts like hands, that are substantially flat.

Referring to FIGS. 1 to 3, a quadrature coil system for receiving the echoes of nuclear spins, particularly suitable to be used in combination with bodies or limbs having a substantially planar profile, especially for detecting Nuclear Magnetic Resonance images of a hand, comprises a first annular elliptical coil 1. The annular elliptical coil 1 generates a magnetic field whose field lines, inside the coil, extend in the axial direction, that is perpendicularly to the plane of the sheet. While the magnetic field generated by a perfectly cylindrical coil would have a very high homogeneity and so a predetermined sensitivity in the whole of its inner volume, the deformation into an ellipse, causes the generation of two areas of concentration of the magnetic field, indicated as B1.

In these areas B1, the magnetic field associated to the coil 1 has a higher intensity. The higher intensity of the areas B1 of the magnetic field corresponds, in accordance with the principle of reciprocity, to a higher receptive sensitivity to the echo signals of nuclear spins. The areas B1 of higher sensitivity are provided at the opposite ends of the major axis of the elliptical section, as indicated as B1 in FIG. 2.

In the remaining central area, the magnetic field has a lower intensity and thus sensitivity, and such a homogeneity that, in the relevant volume, the field of the coil 1 is no longer homogeneous enough to ensure a correspondence between the real situation and the detected image.

The boundary of the areas of higher sensitivity of the magnetic field associated to the coil 1 is defined through criteria that may vary according to the techniques for processing the received signals. These boundaries are determined along lines of equal intensity of the magnetic field associated with the coil 1, corresponding to an attenuation of the intensity of the magnetic field B1 oscillating between 5% and 30%, preferably 20% with respect to its maximum value.

A second coil, a so-called double-saddle coil, indicated as 2, is associated with the first elliptical coil 1 so as to be concentric thereto. The second double-saddle coil is conventionally disposed to be concentric to the first annular coil 1 and is deformed itself in such a manner as to have an elliptical cross section, i.e. to extend over a tubular surface with an elliptical section.

The rectilinear or axial lengths of the saddle coil 2 may extend, as conventionally arranged, 30°, 150°, 210° and 330° with respect to the axis coinciding with the minor axis of the first elliptical coil 1, in such a way that the angular width of each saddle 102 shall be 120°, otherwise the angular position of the lengths may be different. For example, it is possible to increase the angular extension of each saddle 102 in order to concentrate the rectilinear sectors in the region of the axis which is coincident with the minor axis of the first elliptical coil 1.

Particularly the angular extension and the corresponding concentration may be extended to the limits which are compatible with the width of the conductors forming the coils, in such a way as to obtain a more precise matching of the complementary zones of sensibility.

The double-saddle coil 2 generates a magnetic field orthogonal to that of the coil 1, and is deformed in such a way as to contain an area B2 of higher concentration, i.e. of higher intensity, hence of higher sensitivity of the magnetic field, which is coincident with the under-intensity area—as defined according to the above disclosed parameters—of the magnetic field associated with the coil 1, which is provided between the areas B1 of the coil 1. The deformation of the two coils 1 and 2 is chosen in such a manner, that the boundaries between the areas B1 and B2 are coincident, and comply with the above disclosed parameters as regards the intensity of the magnetic field, that is its receptive sensitivity, and its homogeneity.

Therefore, the extension of the areas B1 and B2 of the magnetic field, generated by the two coils 1, 2 are complementary to each other. The comprehensive magnetic field of the two coils together is obtained through an appropriate vector addition of the magnetic fields of the two coils when taken individually. In this vector addition, the component relating to at least one of the two coils, that is, in this case, to the second saddle coil 2 may be appropriately weighted through a factor which may depend, amongst other things, on the values of the signal-to-noise ratios of the single coils 1, 2. The combination of the magnetic fields of the two coils 1, 2 generates a comprehensive field, orthogonal to a polarizing static field covering, with a higher field intensity but with a sufficient homogeneity to obtain valuable images, the whole volume being meant to contain the body under examination or the relevant part thereof.

Even in the double-saddle coil 2, the flattening deformation causes a concentration of the field lines in the area B2 and thus a higher field intensity, with respect to that provided by a substantially circular geometry.

The figures evidently show the advantages of the smaller dimensions of this coil system, with respect to the traditional ones. In fact, the size variations of the hand are generally substantially limited to a direction parallel to the planar shape of the hand, and in this case to the major axis of the elliptical section, whereas in the perpendicular direction, the hand profile may vary very little. The structure with the elliptical section illustrated herein follows much more faithfully the planar shape of the hand and, unlike a structure with a cylindrical shape, it limits the space required to account for the different sizes of the limbs only in the direction of the major axis.

The higher gain for the signal-to-noise ratio is self-evident, thanks to the higher density of the lines of the magnetic field which permeates the volume being meant to contain the hand, the higher density being due to the deformation.

Figure 4:
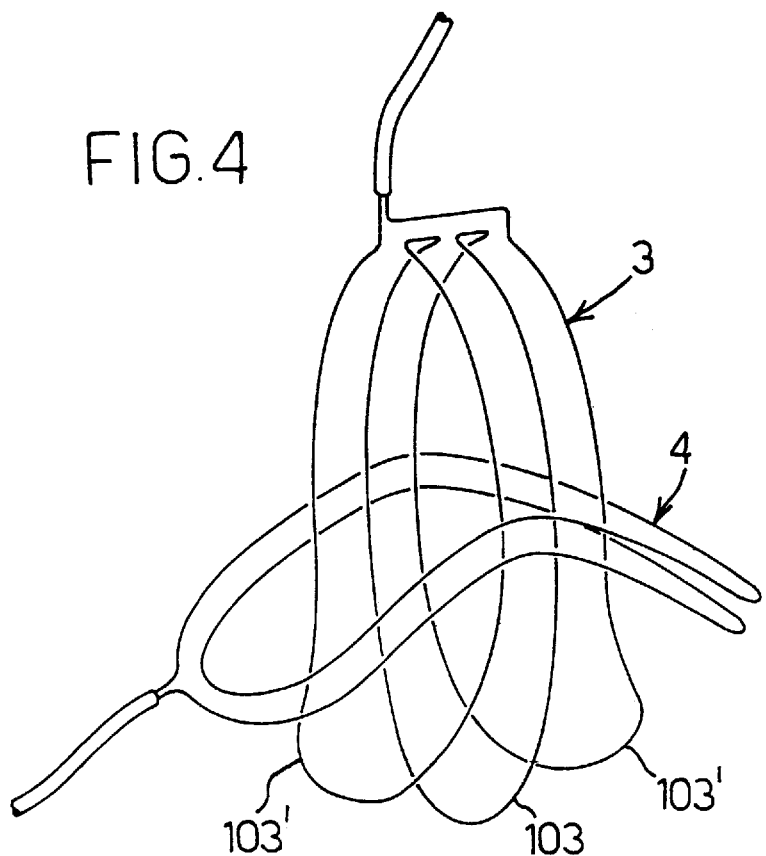
FIG. 4 shows a variant embodiment of the coil system according to the invention, particularly suitable for bodies like feet.
Figure 5:
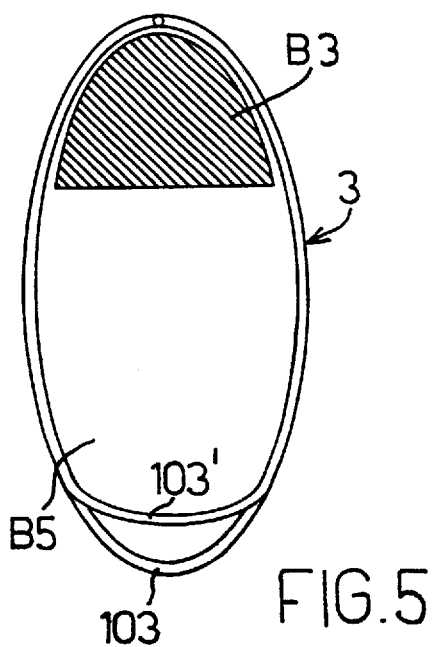
FIGS. 5 and 6 show, like FIGS. 2 and 3, the complementary areas of concentration and thus of higher field sensitivity of the two quadrature coils according to FIG. 4.
Figure 6:
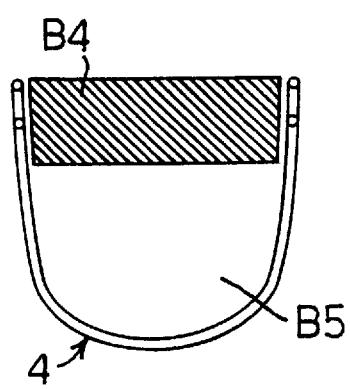

The example in FIGS. 4 to 6 shows a quadrature coil system particularly suitable to be used in combination with a foot.

In this case, beside the simple adaptation to the complex profile of the foot, it is necessary to provide that the insertion of the limb into the predetermined volume inside the coil system and its rest therein are comfortable. Moreover, the illustrated configuration accounts for the lack of relevance of certain areas of the limb, for the purpose of an image detection.

In this example, the first annular coil 3 has a shape which is substantially lanceolate, elliptical, or similar.

However, since in this case, the area of the foot heel is of lower interest, for the purpose of image detection, according to a further characteristic, as shown in FIG. 4, the coil 3 is additionally deformed at one of its ends. As shown in FIG. 4, in the area of one half of the coil 3, on one of the sides of its minor axis, the turns or windings of the coil 3 are laterally curved outwards with respect to the median plane subtended by the central turn or group of turns 103', in particular symmetrically, so that, when seen from the side, in the said area, the turns 103, 103' of the coil 3 take a fan-shaped configuration.

Thanks to this deformation, the coil 3 of the second example has an area of higher sensitivity of the magnetic field which is limited to the area enclosed by the coil 3 on its side opposite to that in which the turns are curved. In the remaining area, the magnetic field has levels of intensity, thus sensitivity, as well as homogeneity which do not comply with the minimum values defined with reference to the previous example.

This expedient allows for a considerable reduction of the intensity of the magnetic field associated with the area of the coil 3 with the inclined turns, preventing a sensitivity dispersion in the area corresponding to a part of the foot which is less relevant for the purpose of image detection.

The center of deformation of the turns of the coil 3 substantially coincides with the area in which it superposes a second coil 4 which may be defined as a simple saddle coil.

The coil 4 has an annular shape and is substantially elliptical or oval, being oriented in such a way as to be substantially perpendicular to the coil 3. Moreover, the coil 4 is bent so as to form an inverted V section, with reference to a section plane containing its major axis, the vertex being provided as substantially coincident with the axis which connects the opposite crossing points and, in particular, substantially coincident with the minor axis of the coil 4.

As is shown in FIG. 6, the area of the magnetic field associated to the coil 4, indicated as B4, in which the magnetic field has a higher intensity, coincides with the central area of the coil 4, directly next to the area of higher intensity B3 of the coil 3. The V deformation also causes a reduction or substantial suppression of the magnetic field in the area of the volume enclosed by the annular coil 3 opposite to the area B3.

In this embodiment, the comprehensive magnetic field resulting form the vector addition of the orthogonal components of the individual coils 3, 4, one of which being appropriately weighted, has a higher intensity and the required homogeneity, and in addition, the said magnetic field is only limited to the areas of the volume enclosed by the system of coils 3 and 4, which substantially corresponds to a part of the foot being relevant for the purpose of Nuclear Magnetic Resonance image acquisition. The heel zone, which is of lower interest for diagnostic researches is found in the area of the volume with a low intensity of the magnetic field.

The criteria for choosing the boundary lines between the areas B3 and B4 correspond to those disclosed above, with reference to the example of FIGS. 1 to 3, and the coils 3 and 4 are deformed in such a way as to comply with those criteria.

As for the dimensions of the coil system and the higher gain of the signal-to-noise ratio, the same considerations relating to the previous example, referred to FIGS. 1 to 3, will be applicable.

According to the principle of reciprocity, which is applicable in this case, the configurations of the quadrature coils illustrated and described with reference to the receiving coils may be also directly applicable to the coils which transmit the excitation pulses of nuclear spins. A higher intensity of the magnetic field corresponds to a higher efficiency or power of the transmitting coils. Therefore, both method and construction, as well as functional considerations described and illustrated with reference to the receiving coils may be applicable to transmitting coils.

The increased efficiency of the transmitting coil system allows for a reduction of an output power of the excitation pulses, and thus for a reduction of energy costs and for a concentration of the available power in the relevant areas of the bodies under examination like in the foot configuration. In addition, the considerations regarding the space required by the receiving coil system are also applicable for transmitting coil systems.

Naturally, the invention is not limited to the embodiments described and illustrated herein, but may be greatly varied, especially as regards construction. Particularly, the invention may be applied to any form of quadrature coils, according to the morphological peculiarities of the body to be examined. Moreover, the inventive concept may be extended, beside the coil systems like those illustrated herein, to all types of means for generating magnetic fields, in particular, intended for other purposes. All this without departure from the guiding principle disclosed above and claimed below.

What is claimed is:

1. A quadrature coil system for nuclear magnetic resonance image acquisition in a given space, the coil system comprising:
   a first coil having a first magnetic field;
   a second coil having a second magnetic field;
   the first magnetic field is substantially orthogonal to the second magnetic field;
   the first coil including a plurality of turns extending substantially uniformly spaced from one end of the given space to another end of the given space;
   the second coil including a plurality of turns extending substantially perpendicular to the turns of the first coil, the turns of the second coil extending over a distance;
   wherein the first magnetic field has a higher intensity in a first area in the given space than in a remaining area of the given space, and the second magnetic field has a higher intensity in a second area in the given space than in a remaining area of the given space, wherein the first and second areas complement each other to form a comprehensive magnetic field with a predetermined intensity and a predetermined homogeneity within the given space.

2. The coil system of claim 1, wherein the first coil is elliptical or oval in shape and has a major axis, and the distance covered by the turns of the second coil is less than the major axis of the first coil.

3. The coil system of claim 2, wherein the second coil is elliptical or oval in shape.

4. The coil system of claim 2, wherein the second coil is elliptical in shape.

5. The coil system of claim 2, wherein the first magnetic field has a higher intensity in a first portion of the given space than in a second portion of the given space.

6. The coil system of claim 5, wherein an intensity of the second magnetic field is not uniform throughout the given space.

7. The coil system of claim 6, wherein the first magnetic field and the second magnetic field complement each other to form a comprehensive magnetic field with a predetermined intensity and a predetermined homogeneity within the given space.

8. The coil system of claim 2, wherein the first magnetic field and the second magnetic field complement each other to form a comprehensive magnetic field with a predetermined intensity and a predetermined homogeneity within the given space.

9. A quadrature coil system for nuclear magnetic resonance image acquisition in a given space, the coil system comprising:
   a first elliptical or oval coil having a first magnetic field;
   a second coil having a second magnetic field that is orthogonal to the first magnetic field;
   the first magnetic field has a higher intensity in a first area in the given space than in a remaining area of the given space, and the second magnetic field has a higher intensity in a second area in the given space than in a remaining area of the given space, wherein the first and second areas complement each other to form a comprehensive magnetic field with a predetermined intensity and a predetermined homogeneity within the given space;
   the first coil including a plurality of turns extending substantially uniformly spaced from one end of the given space to another end of the given space; and the second coil including a plurality of turns extending substantially perpendicular to the turns of the first coil.

10. The coil system of claim 9, wherein the second coil is a double-saddle coil.

11. The coil system of claim 9, wherein the second coil is elliptical or oval in shape.

12. The coil system of claim 9, wherein the first coil is elliptical.

13. The coil system of claim 11, wherein the second coil is elliptical.

14. A quadrature coil system for nuclear magnetic resonance image acquisition in a given space, the coil system comprising:

a first elliptical or oval coil having a first magnetic field;

a second coil having a second magnetic field;

the first magnetic field is substantially orthogonal to the second magnetic field;

the first coil including a plurality of turns extending substantially uniformly spaced from one end of the given space to another end of the given space, and at one end of the ellipse, the turns of the coil are spaced greater from each other than at another end of the ellipse; and the second coil including a plurality of turns extending substantially perpendicular to the turns of the first coil.

15. The coil system of claim 14, wherein the second coil is bent so as to form an inverted v-section having a vertex.

16. The coil system of claim 15, wherein the vertex of the second coil is coincident with a minor axis of the first coil.

* * * * *